United States Patent
Tajiri et al.

(10) Patent No.: US 7,364,771 B2
(45) Date of Patent: Apr. 29, 2008

(54) METHOD AND APPARATUS FOR PRODUCTION OF FLUORINE-CONTAINING POLYIMIDE FILM

(75) Inventors: Kozo Tajiri, Suita (JP); Shinichi Goto, Kakogawa (JP); Yoshinobu Asako, Amagasaki (JP); Kumiko Kawada, Tokyo (JP)

(73) Assignee: Nippon Shokubai Co., Ltd., Osaka (JP)

(*) Notice: Subject to any disclaimer, the term of this patent is extended or adjusted under 35 U.S.C. 154(b) by 219 days.

(21) Appl. No.: 10/795,122

(22) Filed: Mar. 5, 2004

(65) Prior Publication Data

US 2004/0234686 A1 Nov. 25, 2004

(30) Foreign Application Priority Data

Mar. 6, 2003 (JP) ............................. 2003-059331
Mar. 6, 2003 (JP) ............................. 2003-059332

(51) Int. Cl.
*B05D 3/12* (2006.01)

(52) U.S. Cl. ................... 427/240; 427/425; 427/427.4; 118/52; 118/64; 118/320

(58) Field of Classification Search ............ 427/240, 427/425, 377, 427.4; 118/52, 64, 320
See application file for complete search history.

(56) References Cited

U.S. PATENT DOCUMENTS 4,595,548 A 6/1986 St. Clair et al.

(Continued)

FOREIGN PATENT DOCUMENTS

JP A-04-020527 1/1992

(Continued)

OTHER PUBLICATIONS

Notification of Reasons for Application issued in corresponding Japanese Application No. 2003-059332 (translation attached).

*Primary Examiner*—Kristen Jolley
(74) *Attorney, Agent, or Firm*—Occhiuti Rohlicek & Tsao LLP

(57) ABSTRACT

A method for producing a fluorine-containing polyimide film excelling in heat resistance, resistance to chemicals, water repellency, dielectric properties, electrical properties, and optical properties and a spin coater suitable for the method are to be provided. A method for the production of a fluorine-containing polyimide film which comprises forming a coating film of a fluorine-containing polyimide precursor in an atmosphere having a relative humidity thereof adjusted to a level of not more than 50 RH % and then subjecting the fluorine-containing polyimide precursor to heat treatment thereby forming a fluorine-containing polyimide film is provided. By adjusting the relative humidity in accordance with this method, the fluorine-containing polyimide precursor can be prevented from being decomposed by the absorption of moisture and consequently prevent effectively the fluorine-containing polyimide film from forming piriform spots and scratches. Further, by forming the coating film while keeping the coating film sprayed with a gas particularly during the course of spin coating thereby giving rise to a layer of air flow on the coating film, misty substances of the coating solution generated within the spin coater can be prevented from adhering again to the coating film and consequently ensure the production of a coating film of uniform quality. This formation of the layer of air flow can be facilitated by providing the spin coater with a lid and furnishing the lid with a gas feed port.

12 Claims, 5 Drawing Sheets

U.S. PATENT DOCUMENTS

| | | | |
|---|---|---|---|
| 5,068,131 A * | 11/1991 | Eisenbraun et al. | 427/240 |
| 5,233,018 A | 8/1993 | Ando et al. | 528/353 |
| 5,428,102 A | 6/1995 | St. Clair et al. | |
| 5,695,817 A * | 12/1997 | Tateyama et al. | 427/240 |
| 5,766,671 A * | 6/1998 | Matsui | 427/8 |
| 6,033,728 A | 3/2000 | Kikuchi et al. | |
| 6,159,541 A * | 12/2000 | Sakai et al. | 427/240 |
| 2001/0021486 A1 | 9/2001 | Kitano | 430/322 |
| 2002/0041935 A1 | 4/2002 | Inada et al. | 427/421 |

FOREIGN PATENT DOCUMENTS

| | | |
|---|---|---|
| JP | A-05-027414 | 2/1993 |
| JP | 05-166712 | 7/1993 |
| JP | 5-1148 | 8/1993 |
| JP | A-05-291127 | 11/1993 |
| JP | 6-320100 | 11/1994 |
| JP | A-07-239422 | 9/1995 |
| JP | 08-008170 | 1/1996 |
| JP | 8-8170 | 1/1996 |
| JP | 09-015608 | 1/1997 |
| JP | 10-43665 | 2/1998 |
| JP | 2001-250767 | 9/2001 |
| JP | 2002-118051 | 4/2002 |
| JP | A-2002-143749 | 5/2002 |
| JP | 2002-177857 | 6/2002 |
| JP | A-2002-177853 | 6/2002 |
| JP | 2002-239443 | 8/2002 |

* cited by examiner

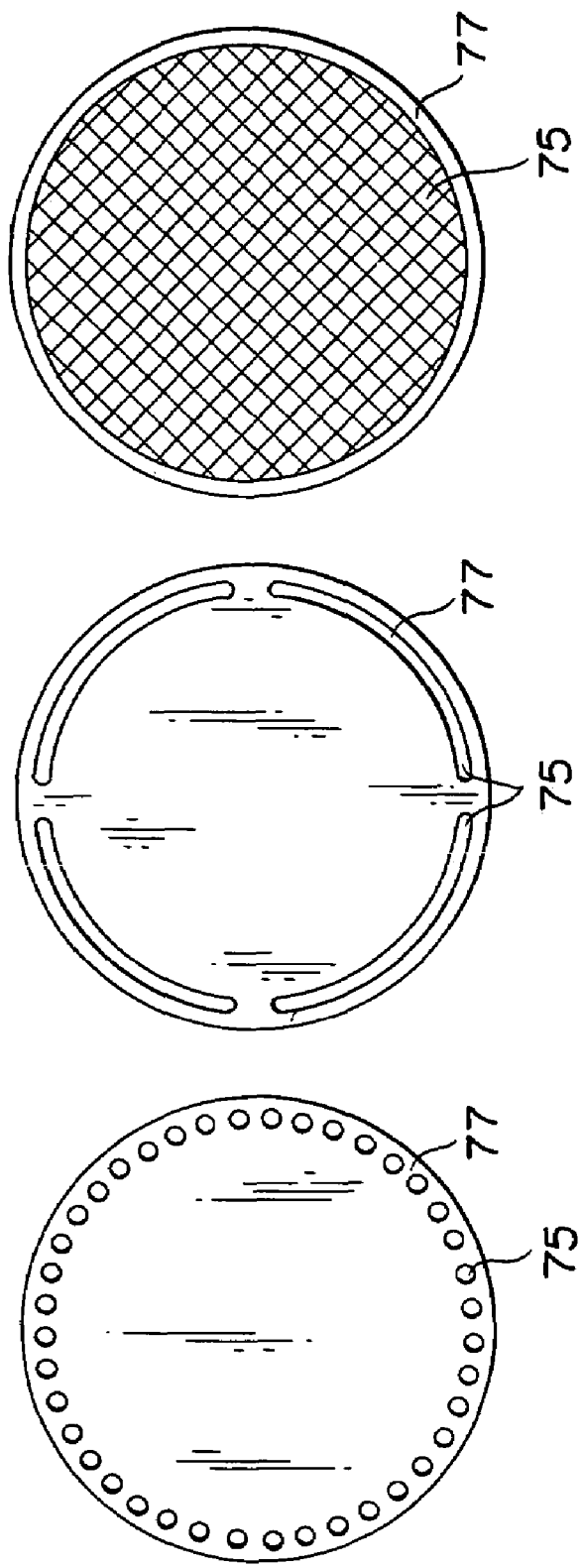

METHOD AND APPARATUS FOR PRODUCTION OF FLUORINE-CONTAINING POLYIMIDE FILM

BACKGROUND OF THE INVENTION

1. Field of the Invention

This invention relates to a method for the production of a fluorine-containing polyimide film excelling in heat resistance, resistance to chemicals, water repellency, dielectric properties, electrical properties, and optical properties. More particularly, this invention relates to a method for the production of a fluorine-containing polyimide film which prevents the generation of piriform spots and scratches by adjusting a relative humidity in an atmosphere during the formation of a film with a fluorine-containing polyimide precursor at a level of not more than 50 RH %.

This invention further relates to a method for the production of a fluorine-containing polyimide film excelling in heat resistance, resistance to chemicals, water repellency, dielectric properties, electrical properties, and optical properties by preventing the adhesion of an excess fluorine-containing polyimide precursor to a substrate during the uniform application of the fluorine-containing polyimide precursor to the surface of the substrate and eventually improving the quality of the produced film, and to a spin coater which can be advantageously used for the method of the production.

2. Description of the Related Art

As the key industry in the information society, the electronics industry is now prospering immensely. Particularly, the electronics age persisting today would not have been created without polymers for insulation and microfine processing. The polymer materials which, by virtue of their main characteristic property of defying the flow of electricity, have supported the advance of industries and technologies of the electronics age can manifest such various functions as ferroelectricity, high conductivity for electrons and ions, superconductivity, as well as ferromagnetism which have been heretofore characteristic of metals, semiconductors, and further inorganic materials, once they are properly conditioned for their molecular and polymeric structures. In recent years, they have been finding an abundant variety of applications such as interlayer insulating films and passivation materials for transistors, thyristors, and IC's, junction coating materials represented by silicone resin, chip coat grade buffer materials for relaxing mold stress, α-ray shielding materials for overcoming soft errors in memory devices, die bonding materials, resist materials, semiconductor sealing materials, moisture-proof coating materials for hybrid IC's, chip carrier tapes for TAB (Tape Automated Bonding), and multilayer circuit substrates. As organic materials of this sort, polyimides for an electronic material have been available. These polyimides have been finding such applications as optical waveguides, multilayer printing substrates, orienting films for liquid crystals, α-ray protecting coats for LSI's, and passivation films.

As other polymer materials which have supported the advance of industries and technologies of the electronics age, fluorine-containing polyimides have been used in terms of their excellent functions and heat resistance. For example, a wholly fluorinated polyimide formed of repeating units consisting solely of carbon-fluorine bonds (C—F bond) instead of carbon-hydrogen bonds (C—H bond) has been disclosed in U.S. Pat. No. 5,750,731 and U.S. Pat. No. 6,048,986. The wholly fluorinated polyimide has heat resistance enough for allowing the manufacture of a photoelectric integrated circuit and has very small light transmission loss in the near-infrared region, particularly in the optical communication wavelength region (1.0-1.7 µm).

As one example of a means for forming a film on a given object, a method which comprises spin coating a coating solution is cited. An apparatus which is used in the popular spin coating method is illustrated in FIGS. 3(A) and (B). A substrate 2 is held as adsorbed on a supporting table (spin table) 3 by virtue of the vacuum from a vacuum generating device not shown in the diagram and a coating solution 30 is delivered dropwise onto the substrate 2 via a nozzle 20. The supporting table 3 is provided around the perimeter thereof with a spin cup 6 adapted to cover the perimeter of the supporting table 3. This spin cup 6 diverges laterally from the upper part of the perimeter of the supporting table 3, reaches the lateral lower part of the supporting table 3, and narrows inward. The spin cup 6 is provided in the interior thereof with a gas outlet 50 which is adapted to discharge downward the atmosphere inside the apparatus (see FIG. 3(A)). When a spin motor 4 is driven to rotate and to induce integral rotation of the supporting table 3 and the substrate 2, a precursor 30 on the substrate 2 is centrifugally spread on the substrate 2 to form a coating film 10 and a misty substance 60 of the coating solution is scattered at the same time. The greater part of the misty substance 60 of the coating solution is expelled as entrained by a current of air directed from an opening formed in the upper part of the spin cup 6 toward a gas outlet 50. As the high-speed rotation of the supporting table 3 and the substrate 2 gives rise to an ascending current of air along the inner wall of the spin cup near the outer periphery of a supporting table 3, however, the misty substance 60 of the coating solution falls from the upper part of the spin cup 6 onto a coating film 10 or the misty substance 60 of the coating solution rebounded from the spin cup 6 possibly falls onto the substrate (see FIG. 3(B)).

With the object of precluding this adverse situation, a spin coater which has an opening formed in the upper part of a supporting table so as to give rise to a flange part on the inner edge of the opening in the outer wall part covering the supporting table and the periphery of the part for imparting a rotational motion thereto, or has the supporting table formed in the shape of a circular truncated cone diverged downward has been disclosed in JP-A-6-320,100. It purports that the spin coater relies on the flange part disposed on the inner edge of the opening on the upper part of the outer wall part to intercept the liquid substance whirling in turbulence near the outer edge of the supporting table and keep it from reaching the surface of the disc being coated.

A spin coater which is provided in the outer periphery of a spin cup with an exhaust vent serving to aspirate the atmosphere above a supporting table and discharge it outside a spin cup has been disclosed in JP-A-10-43,665 and a spin coater which rotates a spin cup in the same direction as a supporting table at such a rotational frequency as that at the point of arriving a chemical liquid scattered from the outer periphery of the supporting table, the velocity of the cup in the direction tangential to the lateral wall thereof and the velocity per minute of the scattered chemical liquid in the same direction as the direction tangential to the lateral wall of the cup are substantially equal has been disclosed in JP-A-2002-177,857. Further, a spin coater which is provided below a supporting table with vanes capable of rotating synchronously with the supporting table and, by dint of a downward air current generated by the vanes, enabled to induce a forced downward flow of the misty substance of a coating solution below the vanes has been disclosed in JP-A-2002-239,443.

For the purpose of forming a polyimide film on a given object, a method which comprises coating the object with polyamic acid, i.e. a precursor of polyimide, as by the spin coating technique or the casting technique and subsequently calcining the resultant coated object has been used. This method, which is directed at a photosensitive polyimide film, is at a disadvantage in suffering the produced photosensitive polyimide film to incur a crack after being developed. With the object of precluding this disadvantage and, at the same time, preventing particles floating in the air of the environment for forming the film from falling on the film being formed and eventually mingling in the finished film, a method for forming a polyimide resin film by producing a coating film of a photosensitive polyimide precursor while introducing and discharging a gas across the film-producing environment and subsequently subjecting the coating film to heat treatment has been disclosed in JP-A-8-8,170. The method disclosed therein is characterized by forming the film of polyimide precursor while controlling the humidity in the region allotted to the formation of the film of photosensitive polyimide precursor. This method has been perfected in view of the fact that, notwithstanding the use of an ordinary polyimide film results in necessitating incorporation of such steps as coating the film with resist, separating the coat of the resist, and etching the finished polyimide film and the use of a photosensitive polyimide results in obviating the necessity for these steps, the photosensitive polyimide possibly suffers the formed film to incur a crack after the step of development. The method mentioned above purports to introduce a gas in the direction parallel to the supporting table from the upper part of the supporting table and discharge the gas to the exterior of the spin coater from the lateral side of the supporting table.

When a fluorine-containing polyimide film is formed by the use of a fluorine-containing polyimide precursor particularly among other species of polyamic acids, however, it is more often than not difficult to obtain a coating film of polyimide precursor having a particularly uniform thickness. Further, the fluorine-containing polyimide film possibly incurs formation of such spots as piriform spots and scratches. The fluorine-containing polyimide films have been finding applications to various kinds of optical materials because of their excellent heat resistance, resistance to chemicals, dielectric properties, electrical properties, and optical properties. A decrease in the yield of the polyimide film mentioned above is directly related to a rise in price, meaning not only an increase in the cost of production of the film but also a decrease of the yield of various optical materials such as printed circuit boards, interlayer insulating films for LSI's, sealing materials for semiconductor parts, optical parts, optoelectronic integrated circuits (OEIC), and optical waveguides in optoelectronic mixed mounting wiring boards. In the existing circumstances, the desirability of developing a method for producing a fluorine-containing polyimide film of highly reliable quality and a method for optimizing the conditions of film manufacture directed at exalting quality has been finding widespread recognition.

SUMMARY OF THE INVENTION

The present inventors, as a result of pursuing a diligent study with a view to accomplishing the various objects mentioned above, have found that a fluorine-containing polyimide precursor containing a carbon-fluorine bond (C—F bond) and comprising specific repeating units reveals very high vulnerability to moisture and, particularly on exposure to a varnish using a solvent with high water absorption, absorbs water unevenly during the course of coating, incurs a local decrease of viscosity, and eventually suffers the produced fluorine-containing polyimide film to sustain piriform spots and scratches and that the problem can be solved by controlling the humidity during the course of the coating to a level of not more than 50 RH %.

The present inventors, as a result of further pursuing a diligent study with a view to attaining the various objects mentioned above, have found that when the fluorine-containing polyimide precursor of such a quality as mentioned above is coated with a varnish using a solvent having particularly high water absorption, it absorbs water unevenly, reveals a local decrease in viscosity, tends to emit a misty substance of the fluorine-containing polyimide precursor, consequently encounters difficulty in forming a polyimide precursor coating film of an uniform thickness, and eventually tends to prevent the produced fluorine-containing polyimide film from acquiring an uniform thickness and that when the polyimide precursor coating film is formed by the technique of spin coating while being sprayed with a gas during the course of the spin coating, this fluorine-containing polyimide precursor coating film can be obtained in an uniform thickness because the spray of the gas serves to preclude the otherwise inevitable fall of the misty substance of the fluorine-containing polyimide precursor on the coated film and prevent the misty substance rebounded from the spin cup from re-adhering to the substrate. The present invention has been perfected as a result.

To be specific, this invention relates to a method for the production of a fluorine-containing polyimide film, characterized by causing a fluorine-containing polyimide precursor to form a coating film in an atmosphere having a relative humidity thereof adjusted to a level of not more than 50 RH % and subsequently subjecting the fluorine-containing polyimide precursor to heat treatment thereby forming a fluorine-containing polyimide film. Particularly, this invention brings excellent effects when the formation of the coating film is carried out by the technique of spin coating and the formation of the fluorine-containing polyimide precursor is effected while the coating film being formed by the spin coating is kept sprayed with a gas. The excellent effects can be also manifested when the fluorine-containing polyimide precursor is a wholly halogenated polyamic acid.

This invention relates to a method for the production of a fluorine-containing polyimide film by forming a coating film of a fluorine-containing polyimide precursor in an atmosphere having a relative humidity thereof adjusted to a level of not more than 50 RH % and then heat-treating the fluorine-containing polyimide precursor. By adjusting the relative humidity at such a level, the fluorine-containing polyimide precursor can be prevented from absorbing moisture, the absorption of moisture from inducing hydrolysis, and the hydrolysis from partially lowering the degree of polymerization and the viscosity. As a result, the produced film can be prevented from generating piriform spots and incurring scratches. Particularly by forming the coating film of the fluorine-containing polyimide precursor in accordance with the spin coating technique while keeping the coating film sprayed with a gas, the re-adhesion of the misty substance of the coating solution can be prevented readily and a fluorine-containing polyimide precursor of high quality can be produced.

Particularly when the fluorine-containing polyimide precursor is a wholly halogenated polyamic acid, this choice benefits the method and allows effective prevention of the hydrolysis.

Since the polyimide film mentioned above can satisfactorily meet high standards of light transparency in an entire communication wavelength zone and excellent heat resistance and excels in resistance to chemicals, water repellency, dielectric properties, electrical properties, and optical properties as well, it is useful for various optical materials such as printed circuit boards, interlayer insulating films for LSI's, sealing materials for semiconductor parts, optical parts, optoelectronic integrated circuits (OEIC), and optical waveguides in optoelectronic mixed mounting wiring boards.

The above and other objects, features and advantages of the present invention will become clear from the following description of the preferred embodiments.

BRIEF DESCRIPTION OF THE DRAWINGS

FIGS. 4(A), (B), and (C) are plan views each illustrating a form of an air vent in a ventilating plate attached to a spin coater of this invention.

DESCRIPTION OF THE PREFERRED EMBODIMENTS

Figure 1:
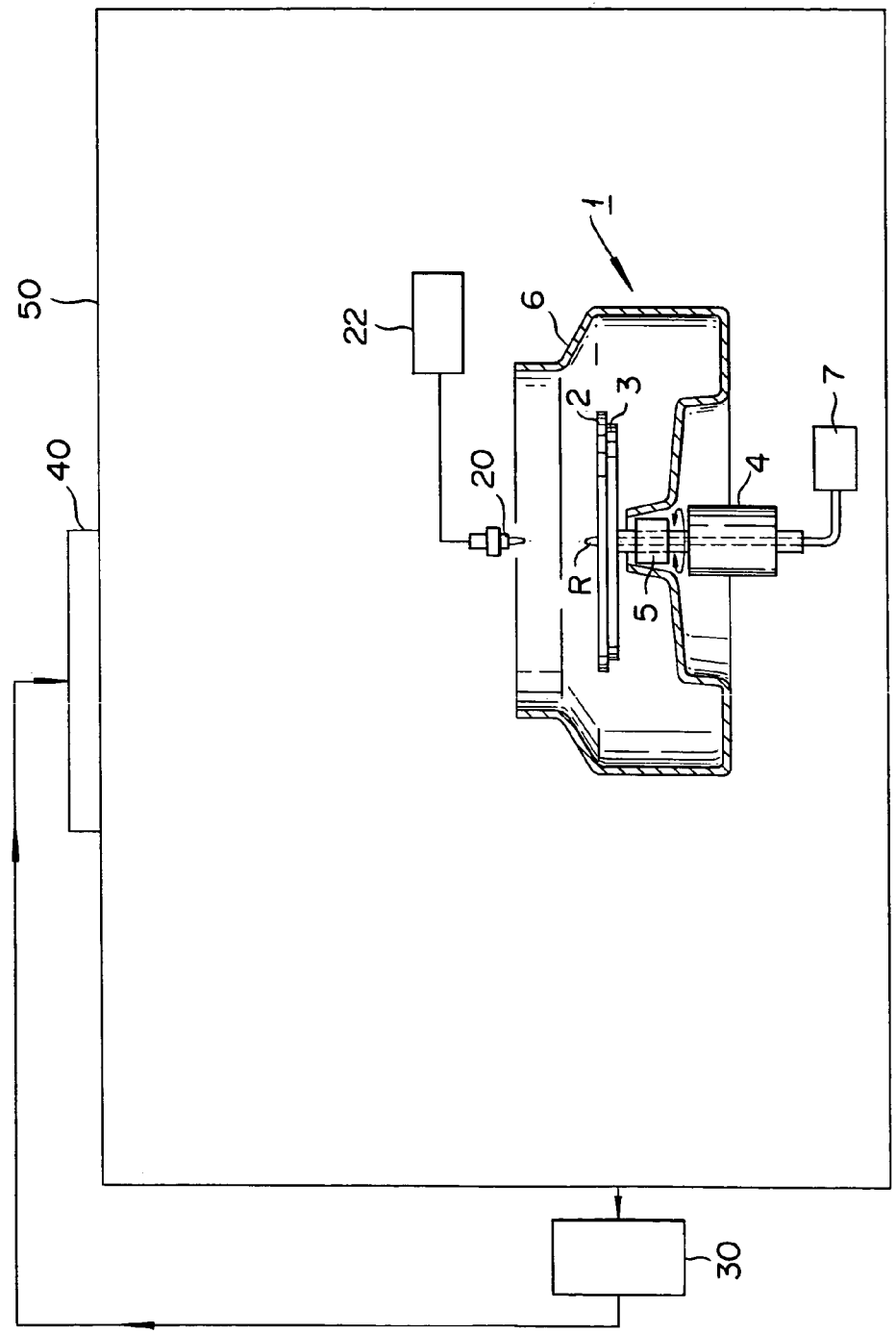
FIG. 1 is a diagram illustrating one example of a preferred mode of forming a coating film of a fluorine-containing polyimide precursor on a substrate by a technique of spin coating according to this invention.

The first aspect of this invention is to provide a method for the production of a fluorine-containing polyimide film which comprises forming a coating film of a fluorine-containing polyimide precursor in an atmosphere having a relative humidity thereof adjusted to a level of not more than 50 RH % and then subjecting the fluorine-containing polyimide precursor to heat treatment thereby forming a fluorine-containing polyimide film. While various methods are available for forming a coating film of the precursor mentioned above and various methods are also available for forming a coating film on a specific substrate, this invention will be described below with reference to a method for producing a fluorine-containing polyimide film by forming a coating film of a fluorine-containing polyimide precursor on a substrate such as, for example, a silicon wafer.

This invention is characterized in forming a coating film of a fluorine-containing polyimide precursor in an atmosphere having a relative humidity thereof adjusted to a level of not more than 50 RH %, preferably not more than 45 RH %, and particularly preferably not more than 40 RH %. The fluorine-containing polyimide precursor is highly susceptible to hydrolysis by water. When it absorbs moisture in an atmosphere during the formation of a coating film, therefore, it is readily decomposed by hydrolysis and suffers the degree of polymerization to decrease and the viscosity to decrease partially. It has been found that this partial decrease of the viscosity generates piriform spots and scratches following the subsequent heat treatment. Thus, the idea of preventing the absorption of moisture and the partial decrease of viscosity and consequently preventing the generation of piriform spots and scratches by effecting the formation of the coating film while adjusting the relative humidity in the atmosphere during the course of the formation of the coating film to a level of not more than 50 RH % has been conceived. So long as the relative humidity is not more than 50 RH %, the generation of pyroform spots and scratches can be precluded even when the wholly halogenated polyamic acid is used as the fluorine-containing polyimide precursor. When the fluorine-containing polyimide precursor is subjected to spin coating in an atmosphere having a relative humidity thereof set at a level exceeding 50 RH %, the fluorine-containing polyimide film itself becomes clouded by absorbing moisture and the polyimide film after the step of calcining is degraded in the quality such as, for example, light loss. In contrast, this invention which consists in forming the coating film of the fluorine-containing polyimide precursor in an atmosphere having the relative humidity thereof set at a level not exceeding 50 RH % is at an advantage in preventing the film from being clouded and being degraded in the quality such as light loss.

Generally, such known methods as casting, spin coating, roll coating, spray coating, bar coating, flexographic printing, and dip coating are available for the purpose of forming an organic synthetic resin film on a substrate. By forming a coating film by applying a fluorine-containing polyimide precursor to the substrate and then calcining the coating film in the atmosphere of an inert gas such as, for example, nitrogen, helium, or argon, it is made possible to form a polyimide film on the substrate. In this invention, the method for forming the coating film does not need to be particularly restricted. The method may be properly selected, depending on the presence or absence of a substrate to be coated with the film, the kind of the substrate, and the kind of the fluorine-containing polyimide precursor destined to form the coating film. When the coating film of the fluorine-containing polyimide precursor is to be formed on the substrate of silicon, for example, the method of spin coating is adopted advantageously because it is capable of quickly forming a thin film of an uniform thickness in a brief period on the substrate.

The mode of forming a coating film of a fluorine-containing polyimide precursor by a method of spin coating on a substrate in an atmosphere having a relative humidity thereof adjusted to a level of not more than 50 RH % will be described below with reference to FIG. 1.

In the formation of a coating film of a fluorine-containing polyimide precursor on a substrate 2, the substrate 2 is adsorbed and fixed fast on a spin table 3 by dint of the vacuum advanced from a vacuum generating device 7 and a fluorine-containing polyimide precursor 22 is dropped (indicated by R) onto the substrate 2 via a nozzle 20. After a lid not shown in the diagram is set on a spin cup 6, a spin motor 4 is set rotating to induce integral rotation of the spin table 3 and the substrate 2. The precursor 22 on the substrate 2 is spread over the substrate by dint of the resultant centrifugal force. After the precursor 22 has been uniformly spread over the substrate 2, the spin motor 4 is stopped to suspend the rotation of the spin table 3 and the substrate 2. Since the thickness of the coating film can be controlled by adjusting the centrifugal force, the coating film can be formed in a desired thickness by adjusting the rotational frequency of the spin motor 4 based on the viscosity of the precursor.

Generally, the hydrolysis of the fluorine-containing polyimide precursor by the absorption of moisture is started from the contact surface between the precursor and the atmosphere. This invention, therefore, has decided to control the relative humidity of the atmosphere contacting the fluorine-containing polyimide precursor to a level of not more than 50 RH % particularly during the step for spreading the liquid drops of the precursor mentioned above. As a means for adjusting the relative humidity of the atmosphere contacting the precursor to a level of not more than 50 RH %, any of the methods which are capable of effecting this control at all may be adopted. A method which controls the relative humidity in a coating film forming chamber 50 to a level of not more than 50 RH % by means of an air conditioning device 30 as illustrated in FIG. 1 may be adopted. This method can be effectively applied to any of the aforementioned methods for the formation of a coating film and, therefore, proves advantageous in respect that it can be easily operated simply by having an air conditioning device duly disposed. According to FIG. 1, the air introduced via the air conditioning device 30 into the coating film forming chamber 50 is manipulated to have the relative humidity thereof adjusted to a level of not more than 50 RH %, passed through a high-performance particle removing filter 40 to be deprived of minute particles, and thereafter introduced into the chamber 50. The air in the chamber, namely, the atmosphere in the chamber once adjusted to a relative humidity of not more than 50 RH %, may be optionally supplied to the air conditioning device 30, controlled therein to a relative humidity of not more than 50 RH %, and circulated again into the chamber via the high-performance particle removing filter 40 as illustrated in FIG. 1. The control of the relative humidity to a level of not more than 50 RH % may be alternatively effected by having such a chemical as calcium chloride which has a high degree of hygroscopicity installed in the chamber instead of using the air conditioning device 30.

When a gas having the relative humidity thereof adjusted to a level of not more than 50 RH % is sent to the neighborhood of the nozzle 20 serving to drop the precursor 22 or the substrate 2, though not shown in FIG. 1, and the coating film is formed in the atmosphere of the gas, then the formation of the coating film of the precursor can be accomplished in the atmosphere having a relative humidity of not more than 50 RH % without requiring the entire coating film forming chamber to be air-conditioned, no matter whether the method of forming the coating film is carried out batchwisely or continuously. To be more specific, as the coating film forming atmosphere, an atmosphere adjusted to a relative humidity of not more than 50 RH % is prepared in advance through the medium of an air conditioning device or a dehumidifying device and this atmosphere is released near the atmosphere for the formation of the coating film via a piping, for example. In the spin coating method, when the precursor 22 is dropped onto the substrate 2 in a spin coater 1 airtight in structure and then a thin film is formed on the substrate 2 in consequence of the rotation of the spin coater 1, it suffices to send the atmosphere adjusted to the relative humidity of not more than 50 RH % as described above into the spin cup 6 illustrated in FIG. 1 via a piping. This modified spin coating method is at an advantage in allowing a saving on the amount of an atmosphere requiring adjustment of relative humidity. This method of supplying the atmosphere adjusted to a relative humidity of not more than 50 RH % exclusively to the neighborhood of the environment for film-formation can be properly applied to a casting method, roll coating method, and bar coating method. Optionally, it may use an apparatus which has laid in advance therein a piping capable of sending the aforementioned atmosphere to the point at which the precursor is supplied onto the substrate.

As the atmosphere for forming the coating film of the fluorine-containing polyimide precursor, the inert gas such as nitrogen, helium, argon, or carbon dioxide may be used besides air. Incidentally, the expression "formation of a coating film" as used in this invention means a step of processing a fluorine-containing polyimide precursor to form a coating film of a prescribed thickness. In the formation of a coating film by the use of a spin coater illustrated in FIG. 1, for example, it means a step starting with the drop of the precursor 22 from the nozzle 20 and ending with the completion of a coating film of an uniform thickness on the substrate 2. The formation of the coating film is generally carried out at a temperature in the range of 20 to 70° C.

FIG. 1 shows the mode of forming a coating film of a fluorine-containing polyimide precursor on a substrate in an atmosphere adjusted to a relative humidity of not more than 50 RH % in accordance with the spin coating method. It is particularly favorable to effect this formation of the coating film while the coating film is kept sprayed with the gas during the course of the spin coating. The fluorine-containing polyimide precursor is so susceptible to hydrolysis by water that when it is made by the atmosphere for the formation of the coating film to absorb moisture, it is easily hydrolyzed, with the result that the degree of polymerization thereof will be lowered and the viscosity thereof will be partially decreased. This partial decrease of the viscosity induces the fluorine-containing polyimide precursor easily to generate a misty substance, which stagnates within the spin coating atmosphere, adheres again to the coating film, or condenses in drops within the atmosphere, drops onto the coating film, and possibly impairs the homogeneity of the coating film. When the coating film is sprayed with the gas, however, an air curtain (layer of air flow) would be formed thereon, prevent the misty substance of the fluorine-containing polyimide precursor from adhering again to the coating film, and consequently allow production of a polyimide precursor coating film of an uniform thickness. One example of the particularly preferable mode of embodying this invention mentioned above will be described specifically below with reference to FIG. 2.

Figure 2:
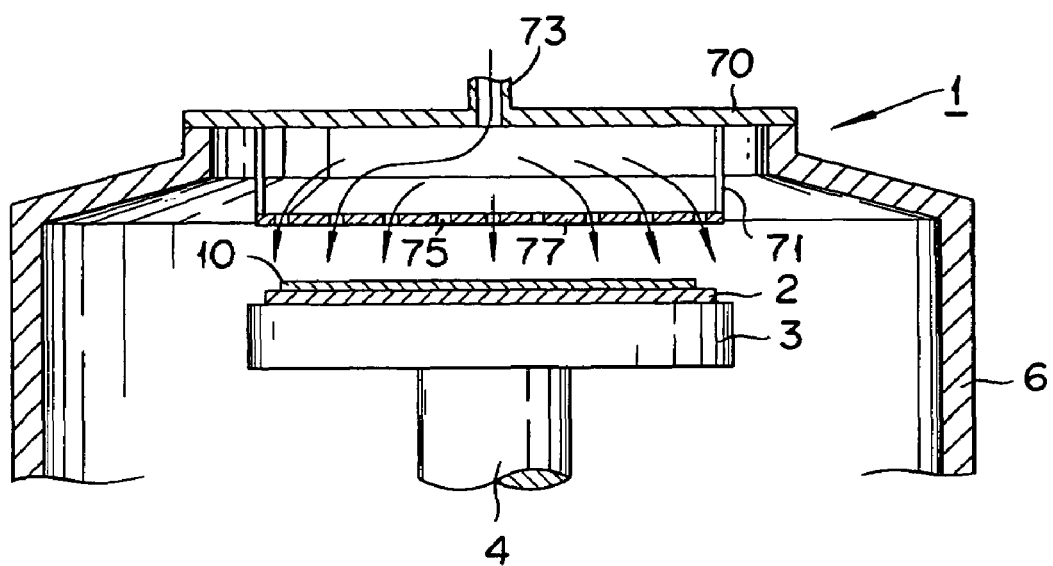
FIG. 2 is a diagram illustrating another example of a preferred mode of forming a coating film of a fluorine-containing polyimide precursor on a substrate by a technique of spin coating according to this invention.

FIG. 2 is a cross section of a spin coater which can be used advantageously in this invention. The spin cup 6 is so disposed as to cover the outer periphery of the supporting table (spin table) 3. This spin cup 6 expands laterally from above the peripheral edge of the supporting table 3, continues this expansion, and eventually reaches the lower lateral part of the supporting table 3. A lid part 70 is disposed on the spin cup 6 and this lid part 70 is provided at the center thereof with a gas feed port 73. On the inner side of the lid part, a venting plate 77 furnished with air pits 75 is fixed through the medium of a guide 71. Incidentally, the substrate 2 may be mounted on the supporting table 3.

For the purpose of forming a coating film by the use of the spin coater, the substrate 2 is adsorbed and fixed fast on the supporting table 3 by dint of the vacuum from a vacuum generating device not shown in the diagram and the fluorine-containing polyimide precursor is dropped onto the substrate 2. This invention is characterized by a procedure which comprises introducing a gas through the gas feed port 73 in the lid part 70 and then sending the gas onto the coating film via the air pits 75 formed in the venting plate 77. The supply of this gas results in forming layers of air flow hanging down from above the coating film 10 and, even when the fluorine-containing polyimide precursor generates misty substances during the course of spin coating, enabling the layers of air flow to fulfill the role of a barrier and prevent the misty substances from contacting the polyimide precursor coating film on the substrate 2. In this invention, therefore, after the polyimide precursor has been dropped onto the substrate 2, first the air is introduced through the gas feed port 73 and allowed to form layers of air flow and then the spin motor 4 is set rotating so that the precursor may form the coating film 10.

The gas supplied through the gas feed port 73 is required not to be reacted with the polyimide precursor. The insert gas such as nitrogen, helium, argon, or carbon dioxide may be used as the gas, besides air. In order that the atmosphere destined to contact the fluorine-containing polyimide precursor (to form a coating film thereof) during the step for spreading the liquid drops of the precursor maybe adjusted to a relative humidity of not more than 50 RH %, the inert gas such as air, nitrogen, helium, argon, or carbon dioxide is adjusted to a relative humidity of not more than 50 RH %, preferably not more than 45 RH %, and particularly preferably not more than 40 RH %. The fluorine-containing polyimide precursor is so susceptible to hydrolysis by water that when it absorbs moisture, it is easily decomposed by hydrolysis and suffers the degree of polymerization thereof to decrease and the viscosity thereof to decrease partially. The hydrolysis of the fluorine-containing polyimide precursor by the absorption of moisture is started from the contact surface between the precursor and the atmosphere. By controlling the atmosphere existing during the formation of the coating film of the precursor to a relative humidity of not more than 50 RH % and also controlling the gas supplied through the gas feed port 73 to a relative humidity of not more than 50 RH %, therefore, the aforementioned decrease of the viscosity can be prevented and consequently the generation of the misty substances of the fluorine-containing polyimide precursor owing to the decrease of viscosity can be also precluded and the coating film can be further prevented from sustaining piriform spots and scratches after the step of calcining. Though the gas which forms the atmosphere for forming the coating film of the fluorine-containing polyimide precursor and the gas supplied through the gas feed port 73 may be identical or different, they are preferred to be identical. The formation of the coating film is generally carried out at a temperature in the range of 20 to 70° C. and the air having a relative humidity in the range mentioned above can be easily prepared by the use of a dehumidifying device.

Though the thickness of the layer of air flow for spraying does not need to be particularly restricted, it falls preferably in the range of 1 to 50 mm, more preferably in the range of 2 to 30 mm, and particularly preferably in the range of 5 to 10 mm. The thickness of the layer of air flow can be approximated by the mean distance between the substrate 2 and the ventilating plate 77. If the thickness of the layer of air flow exceeds 50 mm, the excess would be at a disadvantage in increasing the amount of the gas for the formation of the layer of air flow and enlarging the spin coater. Conversely, if this thickness falls short of 1 mm, the shortage would be at a disadvantage in restricting the amount of the polyimide precursor to be mounted on the substrate 2 and possibly preventing the polyimide film from being formed in an expected thickness. Incidentally, the thickness of the layer of air flow can be easily adjusted by vertically moving the position of the ventilating plate 77 fixed to the guide 71.

The rate of flow of the gas to be supplied can be properly selected in the range of $1.5 \times 10^{-4}$ to 1 m/sec, depending on the amount of the misty substances which the fluorine-containing polyimide precursor is suffered to form. This rate of flow may be heightened when the polyimide precursor has high viscosity and the misty substances are formed in a large amount by the fluorine-containing polyimide precursor or it may be lowered when the misty substances are formed in a small amount by the fluorine-containing polyimide precursor. Generally, if the rate of flow of the gas falls short of $1.5 \times 10^{-4}$ m/sec, the shortage would result in impeding fully satisfactory prevention of the re-adhesion of the misty substances of the fluorine-containing polyimide precursor to the substrate, though depending on the size of the substrate or the spin coater. Conversely, if the rate of flow exceeds 1 m/sec, the excess would be at a disadvantage in suffering the coating film on the substrate to be deformed by the pressure of supply of the gas. The expression "during the spin coating" as used in this invention means a step of processing the fluorine-containing polyimide precursor mounted on the substrate by the rotation of the spin motor so as to form a coating film in an expected thickness.

The gas to be used for this purpose is preferably supplied uniformly onto the coating film 10 in order to prevent the coating film from being deformed by the pressure of supply of the gas. For the purpose of supplying the gas uniformly through the air pits formed in the ventilating plate, therefore, the air pits are preferably distributed uniformly in the ventilating plate. The individual sizes of the air pits preferably have such a degree of uniformity as to uniformize the supply of the air to the coating film.

According to the mode described above, the repeated contact of the misty substances of the fluorine-containing polyimide precursor to the coating film can be avoided because the layers of air flow are formed on the coating film during the course of spin coating. Consequently, the possibility of the misty substances of the fluorine-containing polyimide precursor adhering to the ventilating plate 77 serving to supply the gas is also nil. As a result, the drop of the polyimide precursor from the ventilating plate 77 at the end of the spin coating operation can be avoided from the structural point of view. Moreover, this invention does not need to discharge the atmosphere from the spin coater. This is because one round of the spin coating treatment is completed within a period of two to five minutes so that the absence of this discharge will not bring such harmful effects as excessive pressing by the supplied gas. Further, since the conventional method is directed toward preventing the coating film and the misty substance of the fluorine-containing polyimide precursor from establishing mutual contact by changing the flow of the misty substances and, therefore, is required to be provided with an opening port and an exhaust port for the purpose of controlling the flow of the misty substances of the fluorine-containing polyimide precursor in one fixed direction. This invention, however, can dispense with the exhaust port otherwise necessary for controlling the flow of the misty substances because the coating film itself is positively supplied with the gas and enabled to form a layer of air flow thereon.

In this invention, the rotation of the spin motor 4 is stopped after the coating film 10 formed by the rotation of the spin motor 4 has reached an expected thickness. Incidentally, by continuing the supply of the gas even after the stop of the motor, the misty substances of the fluorine-containing polyimide precursor can be prevented from adhering to the lid part thereby precluding the fall of the misty substances of the fluorine-containing polyimide precursor onto the coating film as well.

In this invention, since the relative humidity of the atmosphere existing during the formation of the coating film of the fluorine-containing polyimide precursor is critical, the precursor does not need to be dissolved or dispersed in advance in a solvent. The precursor is preferably dispersed or dissolved in a solvent and more preferably dissolved in a solvent. The solvent to be used properly in this case does not need to be particularly discriminated but is only required to be capable of dissolving or dispersing the fluorine-containing polyimide precursor. As typical examples of the preferred solvent, polar solvents such as N-methyl-2-pyrrolidinone, N,N-dimethyl acetamide, acetonitrile, benzonitrile, nitrobenzene, nitromethane, dimethyl sulfoxide, acetone, methylethyl ketone, isobutyl ketone, and methanol; and nonpolar solvents such as toluene and xylene may be cited. Among other solvents cited above, N-methyl-2-pyrrolidinone and N,N-dimethyl acetamide are used particularly advantageously. Incidentally, the concentration of the precursor in the solvent is preferably in the range of 10 to 50 mass %. The formation of the coating film is related also to the viscosity of the fluorine-containing polyimide precursor. This viscosity falls preferably in the range of 10 poises to 1000 poises and more preferably in the range of 25 poises to 150 poises.

This invention forms the fluorine-containing polyimide film by subjecting the precursor to such heat treatment as calcining after the coating film of the precursor has been formed on the substrate. The conditions for the heat treatment of the precursor do not need to be particularly discriminated but are only required to be capable of effecting efficient ring opening of the precursor so that the polyimide film may be produced as expected. Specifically, the heat treatment is carried out generally in an air and preferably in an atmosphere of an inert gas such as nitrogen, helium, or argon at a temperature in the range of 70 to 350° C. for a period in the range of 2 to 5 hours. This heat treatment may be performed stepwise or continuously. In the preferred mode of embodiment, the heat treatment of the precursor is properly carried out stepwise; at 70° C. for two hours, at 160° C. for one hour, at 250° C. for 30 minutes, and at 350° C. for one hour.

Incidentally, the heat-treating device is not required to be present in the same atmosphere as the atmosphere used for the formation of the coating film of the fluorine-containing polyimide precursor (spin coater) but may be provided in the coating film forming chamber as well. The heat treatment is generally carried out in the atmosphere of an inert gas such as nitrogen or helium. Since this atmosphere generally does not contain any moisture, the calcining temperature is in the range of 70 to 350° C. which is higher than the range of temperatures for the formation of the coating film, and the relative humidity at such temperatures generally falls short of 50 RH %, the atmosphere existing during the heat treatment should generally satisfy the condition of controlling the relative humidity to a level of not more than 50 RH %. Incidentally, when the coating film is formed of the fluorine-containing polyimide precursor on the substrate, it has the possibility of absorbing moisture while the step of the coating film formation is shifting to the step of the heat treatment and this absorption of moisture likewise has the possibility of inducing partial decrease of viscosity. In this respect, the fact that the spin coater and the heat-treating device are disposed in one and the same chamber and they are adjusted by an air-conditioning device to a relative humidity of not more than 50 RH % proves particularly advantageous because the fluorine-containing polyimide precursor can be treated in the atmosphere controlled to a relative humidity of not more than 50 RH % till the heat treatment is completed. Alternatively, the atmosphere can be retained at a relative humidity of not more than 50 RH % by placing the substrate carrying the formed coating film thereon in a transporting container endowed with air tightness in the atmosphere adjusted to a relative humidity of not more than 50 RH % and then shifting the container to the heat-treating step.

The fluorine-containing polyimide precursor to be used in this invention does not need to be particularly discriminated. The fluorine-containing polyamic acid represented by the following formula (1) can be advantageously used because it excels in heat resistance, resistance to chemicals, water repellency, dialectric properties, electrical properties, and optical properties.

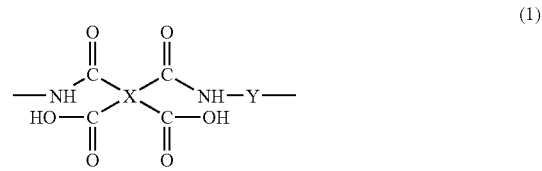

(1)

(wherein X stands for a tetravalent organic group and Y stands for a divalent organic group, providing that either of X and/or Y contains at least one fluorine atom).

X stands for a tetravalent organic group. As typical examples of the tetravalent organic group, tetravalent aliphatic organic groups originating in cyclic alkyls, chain alkyls, olefins, and glycols; tetravalent aromatic organic groups originating in benzene biphenyl, biphenyl ether, bisphenyl benzene, and bisphenoxy benzene; and halogen-containing aliphatic and aromatic organic groups may becited. Among other tetravalent organic groups cited above, tetravalent aromatic organic groups, especially tetravalent halogen-containing aromatic organic groups, are used particularly advantageously as "X" in the foregoing formula (1). As typical examples of the particularly preferable tetravalent organic groups, the tetravalent groups represented by the following formulas

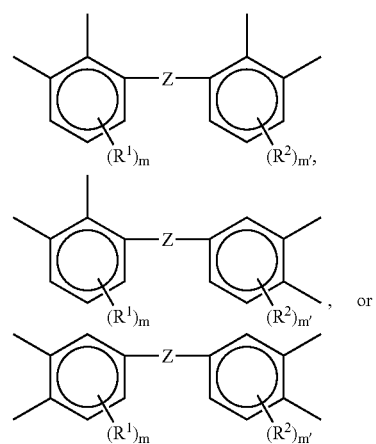

may be cited.

In the formulas representing preferred structures of X in the preceding formula (1), $R^1$ and $R^2$ each stand for a halogen atom, namely a fluorine, chlorine, bromine, or iodine atom, preferably a fluorine or chlorine atom, and most preferably a fluorine atom. In this case, $R^1$ and $R^2$ may be the same or different. When $R^1$ and $R^2$ are each present in a plurality in the corresponding benzene rings (namely, when m and m' each denote 2 or 3), the $R^1$ and $R^2$ may be the same or different in the relevant benzene rings. Then, m and m' represent numbers respectively of $R^1$ and $R^2$ bound to the relevant benzene rings and are integers of 0-3, and the numbers are preferred to be 3 since the absence of a C—H bond is preferred in consideration of heat resistance, resistance to chemicals, water repellency, and dielectric properties. In this case, m and m' may be the same numbers or different numbers.

In the formulas as mentioned above, Z stands for a single bond or a divalent group represented by the following formula:

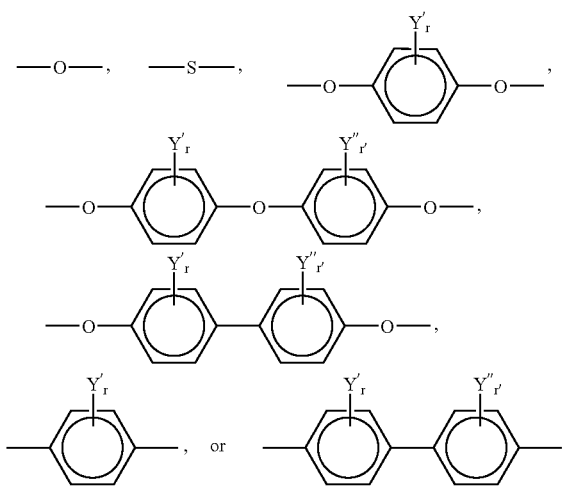

Among other examples cited above, Z preferably stands for a single bond or a divalent group represented by the following formula:

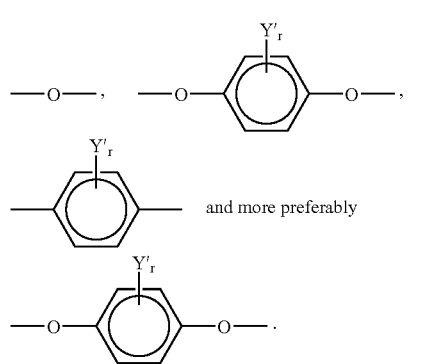

In the preceding formulas representing "Z," Y' and Y" each stand for a halogen atom, namely a fluorine, chlorine, bromine or iodine atom, preferably a fluorine or chlorine atom, and most preferably a fluorine atom. When Y' and Y" are both present in any of the preceding formulas representing "Z", Y' and Y" may be the same or different. When Y' and Y" are each present in a plurality in the corresponding benzene rings (namely when r and r' each are integers of 2 to 4), Y' and Y" may be the same or different in the relevant benzene rings. Then, r and r' represent the numbers respectively of Y' and Y" bound to the relevant benzene rings and are integers in the range of 0 to 4, preferably in the range of 2 to 4, the numbers are most preferably 4 since the absence of a C—H bond is preferred in consideration of heat resistance, resistance to chemicals, water repellency, and dielectric properties. In this case, r and r' may be the same numbers or different numbers.

In the preceding formula (1), Y stands for a divalent organic group, which is preferred to be ① a divalent aliphatic group or aromatic group formed solely of carbon-hydrogen bonds and optionally containing a straight chain, branch, or ring or a divalent organic group containing no halogen atoms and having two or more aliphatic groups or aromatic groups bound with a hetero atom such as oxygen atom, nitrogen atom, or sulfur atom other than carbon atom, or ② a divalent wholly halogenated organic group having all the hydrogen atoms in the carbon-hydrogen bond contained in the organic group in ① above substituted with halogen atoms. Incidentally, the halogen atoms contained in the wholly halogenated organic group do not need to be wholly identical. "Y" may contain different halogen atoms. As typical examples of the organic group containing no halogen indicated in ① above, divalent aliphatic organic groups originating in cyclic alkyls, chain-structure alkyls, olefins, and glycols; divelent aromatic organic groups originating in benzene biphenyl, biphenyl ether, bisphenyl benzene, and bisphenoxy benzene; and aromatic organic groups may be cited. As typical examples of ② the wholly halogenated organic group, the organic groups which result from substituting whole of the hydrogen atoms of the organic groups containing no halogen indicated in ① with halogen atom(s) may be cited.

The divalent organic group which is represented by "Y" in the preceding formula (1) is preferably any of the divalent organic groups indicated in ① and ② below. Among other divalent organic groups cited below, the organic groups of ② are most preferable in consideration of heat resistance, resistance to chemicals, water repellency, and dielectric properties.

①

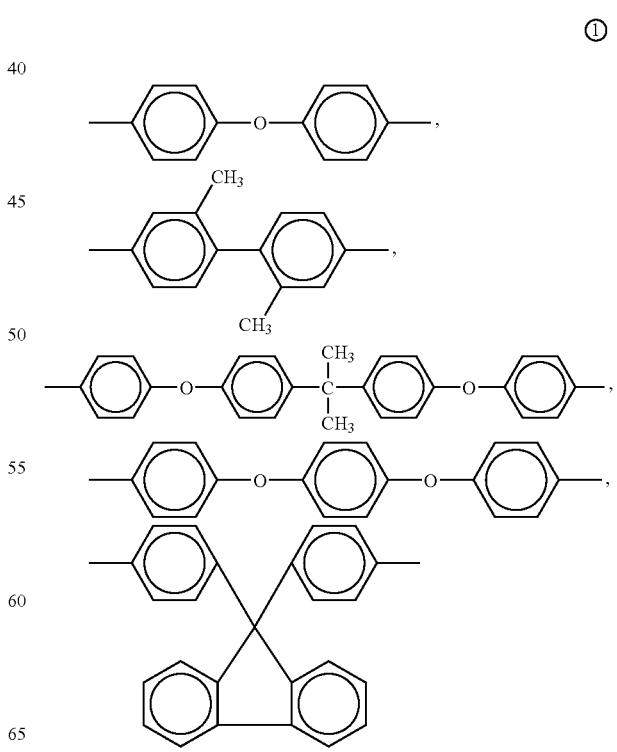

and the like

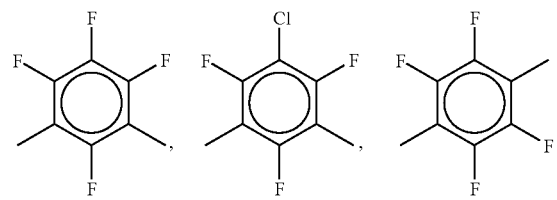

and the like

In this invention, it is essential that the polyamic acid represented by the preceding formula (1) should contain at least one fluorine atom. The polyamic acid having repeating units represented by the preceding formula (1) is enabled by the presence of these repeating units to impart an expected refractive index (namely the difference of refractive index An relative to the existing wholly halogenated polyimide) to the polyimide destined to be formed. The polyamic acid mentioned above preferably has no carbon-hydrogen bonds (C—H bond) in consideration of the light transmission loss in the near infrared zone, particularly in the optical communication wavelength zone (1.0-1.7 μm). From this point of view, the polyamic acid preferably result from substituting all the hydrogen atoms bound to the carbons forming the preceding formula (1) with halogen atoms (hereinafter referred to as "wholly halogenated polyamic acid"). Such wholly halogenated polyamic acid can be a raw material for a fluorine-containing polyimide film which excels in heat resistance, resistance to chemicals, water repellency, dielectric properties, electrical properties, and optical properties.

The method for producing the polyamic acid represented by the preceding formula (1) will be described in detail below. From this description, it is inferred that the polyamic acid terminates in either an amine or an acid derivative, though variable with the amounts of a diamine compound and a tetracarboxylic acid derivative to be added (molar ratios). Incidentally, the polyamic acid may be formed of identical repeating units or different repeating units. In the latter case, the repeating units may be either in a block form or a random form.

The polyamic acid can be produced by properly combining known techniques. The method of this production does not need to be particularly discriminated. Generally, a method which comprises reacting a diamine compound represented by the following formula (2) with a tetracarboxylic acid represented by the following formula (3), an acid anhydride or acid chloride thereof, or an ester compound thereof in an organic solvent can be preferably adopted. The symbol "Y" in the following formula (2) and the symbol "X" in the following formula (3) have the same definitions as in the preceding formula (1).

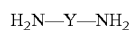

(2)

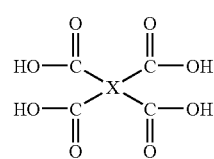

(3)

The diamine compound represented by the preceding formula (2) does not need to be particularly restricted but is only required to have such a structure as reacts with a tetracarboxylic acid represented by the preceding formula (3) and consequently produces a polyamic acid represented by the preceding formula (1). In view of the structure of a preferred polyamic acid, the compounds indicated in ① and ② below prove particularly advantageous. Incidentally, these diamine compounds may be used either singly or in the form of a mixture of two or more members.

① : 4,4'-Diaminodiphenyl ether, 2,2-dimethyl-4,4'-diaminobiphenyl, 2,2-bis[4-(4-amino-phenoxy) phenyl] propane, 1,4-bis(4-aminophenoxy) benzene, and 9,9-bis(4-aminophenyl) fluorene;

② : 5-Chloro-1,-diamino-2,4,6-trifluorobenzene, 2,4,5,6-tetrachloro-1,3-diaminobenzene, 2,4,5,6-tetrafluoro-1,3-diaminobenzene, 4,5,6-trichloro-1,3-diamino-1-fluorobenzene, 5-bromo-1,-diamino-2,4,6-trifluorobenzene, and 2,4,5,6-tetrabromo-1,3-diaminobenzene can be preferably cited. Among other compounds cited above, 2,4,5,6-tetrafluoro-1,3-diaminobenzene and 5-chloro-1,3-diamino-2,4,6-trifluorobenzene prove particularly advantageous.

Meanwhile, the tetracarboxylic acid represented by the preceding formula (3), acid anhydride thereof, or acid chloride thereof does not need to be particularly discriminated. It can be produced by a known technique such as, for example, the method disclosed in JP-A-11-147,955 or a combination of such known techniques. As typical examples of the tetracarboxylic acid, halogenated tetracarboxylic acids of the preceding formula (3) such as hexafluoro-3,3',4,4'-biphenyltetracarboxylic acid, hexachloro-3,3',4,4'-biphenyltetracarboxylic acid, hexafluoro-3,3',4,4'-biphenyl ether tetracarboxylic acid, hexachloro-3,3',4,4'-biphenyl ether tetracarboxylic acid, bis(3,4-dicarboxytrifluorophenyl) sulfide, bis(3,4-dicarboxytrichlorophenyl) sulfide, 1,4-bis(3,4-dicarboxytrifluorophenoxy) tetrafluorobenzene, 1,4-bis(3,4-dicarboxytrichlorophenoxy) tetrafluorobenzene, 1,4-bis(3,4-dicarboxytrifluorophenoxy) tetrachlorobenzene, 1,4-bis(3,4-dicaraboxytrichlorophenoxy) tetrachlorobenzene, 3,6-difluoropyromellitic acid, 3,6-dichloropyromellitic acid, and 3-chloro-6-fluoropyromellitic acid; acid dianhydrides corresponding thereto; acid chlorides corresponding thereto; and corresponding ester compounds such as methyl esters and ethyl esters may be cited. Among other tetracarboxylic acids cited above, hexafluoro-3,4',4,4'-biphenyl tetracarboxylic acid, hexafluoro-3,3',4,4'-biphenyl ether tetracarboxylic acid, 1,4-bis(3,4-dicaraboxytrifluorophenoxy) tetrafluorobenzene, 1,4-bis(3,4-dicarboxytrifluorophenoxy) tetrachlorobenzene, acid dianhydrides and acid chlorides corresponding thereto prove advantageous and hexafluoro-3,3',4,4'-biphenyl ether tetrcarboxylic acid, 1,4-bis(3,4-dicarboxytrifluorophenoxy) tetrafluorobenzene, 1,4-bis(3,4-dicarboxytrifluorophenoxy) tetrachlrorobenzene, and acid dianhydrides thereof prove particularly favorable. Incidentally, these halogenated tetracaraaboxylic acid derivatives may be used either singly or in the form of a mixture of two or more members.

A polyamic acid aimed at can be produced by a method which comprises reacting the diamine compound represented by the preceding formula (2) as with the tetracaraboxylic acid of the preceding formula (3) in an organic solvent.

The amount of the aforementioned diamine compound to be added does not need to be particularly discriminated but is only required to perform the effective reaction of this compound as with tetracarboxylic acid. To be specific, the amount of the diamine compound to be added is equal stoichiometrically to the number of moles to the tetracarboxylic acid derivative mentioned above. It falls preferably in the range of 0.8 to 1.2 moles and more preferably in the range of 0.9 to 1.1 moles, based on the total number of moles of the tetracarboxylic acid taken as 1 mole. In this case, if the amount of the diamine compound to be added is less than 0.8 mole, the shortage would result in suffering the tetracarboxylic acid to remain unaltered in a large amount, possibly complicating the process of purification, and preventing the degree of polymerization from increasing.

Conversely, if this amount exceeds 1.2 moles, the excess would result in suffering the diamine compound to remain unaltered in a large amount, possibly complicating the process of purification, and preventing the degree of polymerization from increasing.

The reaction can be carried out in an organic solvent. The reaction between the diamine compound and the tetracarboxylic acid proceeds efficiently. It does not need to be particularly discriminated but is only required to enable the diamine compound and the tetracarboxylic acid to react efficiently and manifest inactivity to these raw materials.

As typical examples of the organic solvent, polar organic solvents such as N-methyl-2-pyrrolidinone, N,N-dimethyl acetamide, N,N-dimethyl formamide, dimethyl sulfoxide, sulfolane, methylisobutyl ketone, acetonitrile, and benzonitrile may be cited. Incidentally, these organic solvents may be used either singly or in the form of a mixture of two or more members. The amount of the organic solvent does not need to be particularly discriminated but is only required to allow the diamine compound and the tetracarboxylic acid to react efficiently. It is preferred to be such that the concentration of the diamine compound in the organic solvent may fall preferably within the range of 1 to 80 mass % and more preferably within the range of 5 to 50 mass %.

The reaction conditions between the diamine compound and the tetracarboxylic acid does not need to be particularly discriminated but is only required to be such that the reaction may be allowed to proceed thoroughly. The reaction temperature, for example, falls preferably within the range of 0 to 100° C. and more preferably within the range of 20 to 50° C. Then, the reaction time falls generally within the range of 1 to 72 hours and preferably within the range of 2 to 48 hours. Though the reaction may be carried out under increased pressure, normal pressure, or reduced pressure, it is preferably performed under normal pressure. Further, the reaction between the diamine compound and the tetracarboxylic acid is preferably carried out in an atmosphere of dried inert gas in consideration of reaction efficiency and degree of polymerization. The relative humidity of the atmosphere of this reaction is preferably not more than 10 RH % and more preferably not more than 1 RH %. As the inert gas, nitrogen, helium, argon, etc. are available.

When the polyamic acid is subjected to heat-treatment, a corresponding polyimide is produced. Though the heat treatment of the polyamic acid may be carried out either in the presence of a solvent or in the absence of a solvent, it is preferably performed in a solvent in consideration of such factors as the efficiency of the reaction. In this case, the polyamic acid may be heat-treated in the form of a solution obtained by the reaction of the diamine compound with the tetracarboxylic acid owing to the step for the production of the polyamic acid mentioned above or the polyamic acid may be separated in a solid from the solution, then redissolved in a solvent, and subjected to the heat treatment.

The polyimide film obtained by heat-treating the polyamic acid mentioned above excels in heat resistance, resistance to chemicals, water repellency, dielectric properties, electrical properties, and optical properties. This film, therefore, is useful for various optical materials such as printed circuit boards, interlayer insulating films for LSI's, sealing materials for semiconductor parts, optical parts, optoelectronic integrated circuits (OEIC), and optical waveguides in optoelectronic mixed mounting wiring boards.

The second aspect of this invention is to provide a spin coater which is provided with a substrate placed in a container and coated with a coating solution, a supporting table supporting the substrate on the upper surface thereof, and a container lid disposed on the substrate, characterized by that the lid is provided with a gas feed port for feeding a gas to the substrate. The spin coater of this invention can be properly used for the first aspect of this invention described above. As the typical embodiment, as illustrated in FIG. 2, a spin coater 1 is characterized in being provided with a lid 70, the lid 70 being provided with the gas feed port 73. Thus, the conventional spin coater, on adding a lid furnished with a gas feed port, can form the spin coater of this invention.

The lid which is provided with a gas feed port and used in this invention preferably has the ventilating plate 77 fixed thereon through the medium of the guide 71 and this ventilating plate 77 furnished with a plurality of air pits 75. The gas can be supplied to the coating film 10 through the medium of the air pits 75. Owing to this lid, the gas can be supplied uniformly onto the coating film 10. The distance between the supporting table and the lid 70 can be calculated such that the distance between the ventilating plate 77 and the substrate 2 can be adjusted to a level falling within the range of 1 to 50 mm, preferably in the range of 2 to 30 mm, and particularly preferably in the range of 5 to 10 mm.

The spin coater of this invention is preferably capable of adjusting the atmosphere for the formation of the coating film of the fluorine-containing polyimide precursor to a relative humidity of not more than 50 RH %. The fluorine-containing polyimide precursor is so susceptible to hydrolysis by water that when it absorbs moisture of the atmosphere existing during the formation of the coating film, it is easily decomposed by the hydrolysis and suffers the degree of polymerization thereof to decrease and the viscosity thereof to decrease partially. Since this partial decrease of the viscosity generates piriform spots and scratches following the subsequent heat treatment, the occurrence of the piriform spots and scratches can be precluded by forming the coating film while adjusting the atmosphere existing during the formation of the coating film to a relative humidity of not more than 50 RH % thereby obviating the absorption of humidity and the partial decrease of viscosity mentioned above. So long as the relative humidity is not more than 50 RH %, the occurrence of piriform spots and scratches can be avoided even when the wholly halogenated polyamic acid is used as the fluorine-containing polyimide precursor.

Figure 5:
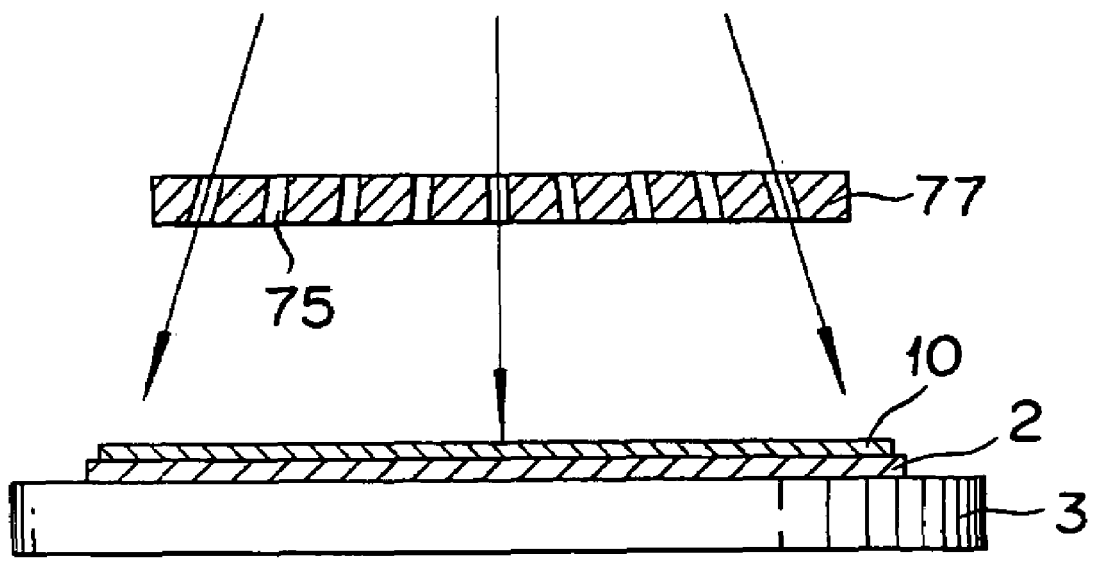
FIG. 5 is a diagram illustrating a positional relation of a ventilating plate, a coating film, a substrate, and a supporting table respectively attached to a spin coater of this invention.

Then, the spin coater of this invention is preferably capable of supplying a gas at a rate of flow in the range of $1.5 \times 10^{-4}$ to 1 m/sec with the object of forming a layer of air flow on the coating film and preventing the misty substances of the coating solution from adhering again to the coating film. The gas is preferably supplied uniformly to the coating film. Thus, the shape, number, and size of the air pits 75 formed in the ventilating plate 77 do not need to be particularly restricted but are only required to be such that the amount of air flow specified above is secured. For example, the air pits 75 may be circular holes disposed uniformly as equally spaced along the inner periphery of the ventilating plate 77 as illustrated in FIG. 4(A), four through-holes of ¼ arc disposed along the inner periphery as illustrated in FIG. 4(B), or a reticular structure imparted to the ventilating plate 77 as illustrated 4(C). While the structure of FIG. 4(C) is intended to supply the gas uniformly to the substrate 2, the modes of FIG. 4(A) and (B) which supply the gas exclusively to the neighborhood of the outer periphery of the substrate 2 are acceptable because they are capable of forming a blocking flow enough for preventing the misty substances from adhering again to the coating film. Incidentally, this invention does not need to be restricted to the mode described above but is only required to be capable of preventing the misty substances from contacting the coating film again in consequence of the spray of the air current. Thus, the air pits 75 may be formed so as to penetrate the ventilating plate 77 vertically. Optionally, they may be formed vertically in the central part of the ventilating plate 77 and in an inclined form from the inflow side to the outflow side in the outer peripheral part as illustrated in FIG. 5. FIG. 5 illustrates the relation of the ventilating plate 77 with the air pits 75, the coating film 10, the substrate 2, and the supporting table 3. When the outwardly inclined air pits are present therein, the ventilating plate 77 can supply the gas also to the outer peripheral part of the coating film 10 even when the ventilating plate 77 has a smaller surface area than the substrate 2. The ventilating plate 77, therefore, allows the lid to be compact. The arrow marks in FIG. 5 indicate the flows of the gas.

Since this invention is only required to supply the substrate 2 with the gas so as to form a flow of air on the substrate 2, the surface area of the substrate 2, the surface area of the supporting table 3 for carrying the substrate 2, and the surface area of the ventilating plate 77 do not need to be particularly restricted. Since the substrate 2 is mounted on the supporting table 3 and since the surface area of the ventilating plate substantially define the cross section of the layer of air flow, the surface area of the ventilating plate is generally preferred to fall preferably within the range of 0.8 to 2 mm$^2$ based on the surface area of the supporting table taken as 1 mm$^2$. If this surface area is less than 0.8 mm$^2$, the shortage would result in suffering the coating film to form a portion inhibiting the formation of a layer of air flow, encountering difficulty in preventing the misty substances of the fluorine-containing polyimide precursor from contacting the coating film again during the course of the spin coating, and possibly suffering the polyimide precursor adhering to the lid 70 to drop onto the coating film 10 after the step of spin coating. Conversely, if the surface area exceeds 2 mm$^2$, the excess would be at a disadvantage in suffering the apparatus to have an unduly large size.

Similarly, the supporting table is preferably disposed below the ventilating plate 77. This arrangement is directed toward preventing the misty substances of the fluorine-containing polyimide precursor or the aggregate thereof which falls from the neighborhood of the lid inside the spin coater left standing after the completion of the spin coating from adhering to the supporting table, the substrate, or the coating film.

Figure 3A:
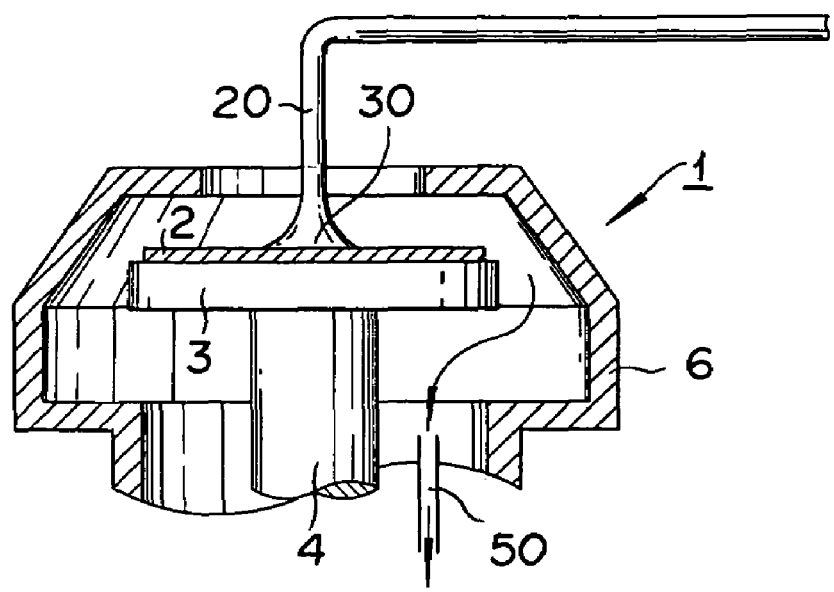
FIGS. 3(A) and 3(B) are diagrams illustrating a conventional spin coater.
Figure 3B:
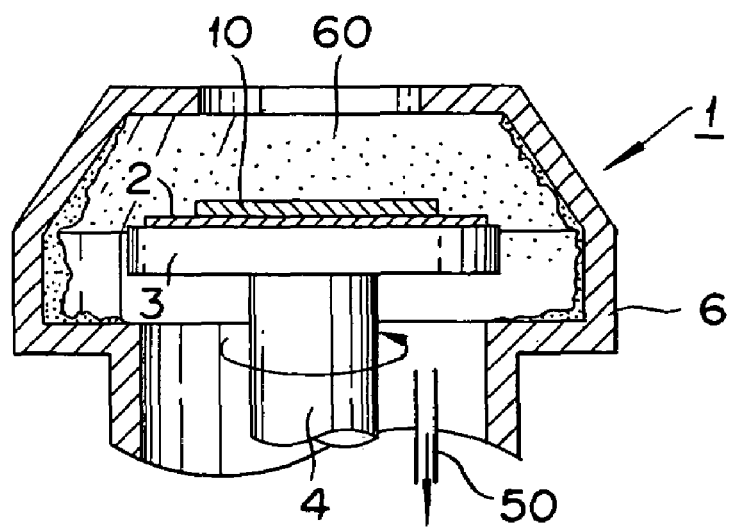

This invention, as described above, contemplates forming a layer of air flow on the coating film 10 with the object of preventing the misty substances of the fluorine-containing polyimide precursor from contacting the coating film 10. Unlike the preceding mode, therefore, the gas is not required to pass the fixed ventilating plate 77 through the medium of the guide 71 and reach the coating film 10. For example, the lid 70 may be furnished with a plurality of air pits so that the gas may be supplied to the interior of the spin coater through the medium of the air pits. Where the coating film can be sprayed with the gas, the guide and the ventilating plate shown in FIG. 3 may be omitted. The shape of the spin cup 6 does not need to be particularly restricted but is also required to allow provision in the upper part thereof with a lid having an air feed port.

Further, this invention does not require the provision of an exhaust vent which serves to discharge the atmosphere contained inside the spin coater. Heretofore, it has been customary to open the upper part of the spin coater and provide therein with an exhaust vent adapted to discharge the atmosphere from the spin coater so that the flow of air advancing from the opening toward the exhaust vent may be controlled and the adhesion of the misty substances of the fluorine-containing polyimide precursor to the coating film may be prevented. This flow of air has low pressure of supply of the gas and therefore is destined to encounter difficulty in completely precluding the adhesion of the misty substances of the fluorine-containing polyimide precursor to the coating film. This invention is enabled, by positively supplying the air to the coating film 10 thereby forming a barrier of a layer of air flow on the coating film, to preclude to a great extent the adhesion of the misty substances of the fluorine-containing polyimide precursor to the substrate and the contamination of the coating film owing to the fall of the polyimide precursor from the spin coater. In the light of this principle, this invention can be executed even in the absence of an exhaust vent which serves to discharge the atmosphere from the spin coater to the exterior. In contrast, the discharge of the atmosphere through the exhaust vent may be carried out so long as the layer of air flow is formed on the coating film.

Incidentally, the guide 71 does not need to be provided with the air pits for the purpose of enabling the gas introduced through the gas feed port 73 to be efficiently discharged through the air pits 75. The provision of the guide with the air pits, however, is at an advantage in efficiently preventing the adhesion of the misty substances of the fluorine-containing polyimide precursor to the coating film because the air pits allow formation of flow of air parallelly to the lid.

This invention may allow the spin coater to be provided with a nozzle for feeding the coating solution. A nozzle for the supply of the coating solution can be omitted because the coating solution may be placed on the substrate even manually.

According to the spin coater of this invention, the coating film of the fluorine-containing polyimide precursor can be easily produced. Further, the provision of the conventional spin coater with the lid mentioned above can be carried out by easy modification to form a spin coater of this invention.

EXAMPLES

Now, this invention will be specifically described with reference to the working examples cited herein below.

Synthesis Example 1

A three-neck flask having an inner volume of 50 ml was charged with 1.80 g (10 m.moles) of 1,3-diamino-2,4,5,6-tetrafluorobenzene, 5.82 g (10 m.moles) of 4,4'-[(2,3,5,6-tetrafluoro-1,4-phenylene) bis(oxy)] bis(3,5,6-trifluorophthalic anhydride) represented by the following formula:

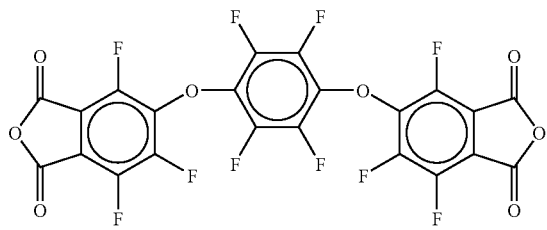

and 10.3 g of N,N-dimethyl acetamide. The resultant mixed solution was stirred in an atmosphere of nitrogen at room temperature for two days to obtain a polyamic acid solution (aqueous 42.5 mass % polyamic acid solution).

Synthesis Example 2

A three-neck flask having an inner volume of 50 ml was charged with 1.97 g (10 m.moles) of 5-chloro-1,3-diamino-1,4,6-trifluorobenzene, 5.82 g (10 m.moles) of 4,4'-[(2,3,5,6-tetrafluoro-1,4-phenylene) bis(oxy)]bis(3,5,6-trifluorophthalic anhydride) to be used in Synthesis Example 1, and 11.7 g of N,N-dimethyl acetamide. The resultant mixed solution was stirred in an atmosphere of nitrogen at room temperature for two days to obtain a polyamic acid solution (aqueous 40.0 mass % polyamic solution).

Synthesis Example 3

A three-neck flask having an inner volume of 50 ml was charged with 3.49 g (10 m.moles) of 9,9-bis(4-aminoplhenyl) fluorene, 5.82 g (10 m.moles) of 4,4'-[(2,3,5,6-tetrafluoro-1,4-phenylene) bis(oxy)]bis(3,5,6-trifluorophthalic anhydride) to be used in Synthesis Example 1, and 21.7 g of N,N-dimethyl acetamide. The resultant mixed solution was stirred in an atmosphere of nitrogen at room temperature for two days to obtain polyamic acid solution (aqueous 30.0 mass % polyamic acid solution).

Example 1

A coating film was formed by the use of a spin coater installed in a coating film forming chamber illustrated in FIG. 1. The air having the relative humidity thereof adjusted with the air conditioning device 30 was treated by HEPA 40 to remove minute particles and then introduced into the coating film forming chamber 50 so as to adjust the relative humidity in the chamber to 35 RH %. Inside this chamber, the aqueous 42.5 mass % polyamic acid solution obtained in Synthesis Example 1 was dropped onto a substrate 2 of silicon wafer and spin-coated thereon to produce a film so as to give a thickness after heat-treatment of 15 μm.

Subsequently, the coating film was heat-treated in an atmosphere of nitrogen at 70° C. for two hours, at 160° C. for one hour, at 250° C. for 30 minutes, and at 350° C. for one hour. The coating film obtained by the calcining had a flat smooth surface free from piriform spots.

Example 2

A calcined coating film was obtained by following the procedure of Example 1 while changing the concentration of the polyamic acid to 40.0 mass % by adding N,N-dimethyl acetamide. This calcined coating film had a flat smooth surface free from piriform spots.

Example 3

A calcined coating film was obtained by following the procedure of Example 1 while changing the relative humidity to 36 RH % and the conditions of the heat treatment to 300° C. for one hour. The calcined coating film had a flat smooth surface free from piriform spots.

Example 4

A calcined coating film was obtained by following the procedure of Example 1 while changing the relative humidity to 36 RH % and using the polyamic acid obtained in Synthesis Example 2 instead. The calcined coating film had a flat smooth surface free from piriform spots.

Example 5

A calcined coating film was obtained by following the procedure of Example 4 while changing the conditions of the heat treatment to 300° C. for one hour. The calcined coating film had a flat smooth surface free from piriform spots.

Comparative Example 1

A calcined coating film was obtained by following the procedure of Example 1 while changing the relative humidity to 60 RH %. The calcined coating film contained numerous spots of foreign matter and numerous radially extending streaks on the surface thereof.

Comparative Example 2

A calcined coating film was obtained by following the procedure of Example 3 while changing the relative humidity to 56 RH %. The calcined coating film contained numerous spots of foreign matter on the surface thereof.

Example 6

A coating film was formed by the use of a spin coater installed in the coating film forming chamber illustrated in FIG. 2 and having the relative humidity thereof adjusted to 35 RH %. First, a 42.5 mass % polyamic acid solution obtained in Synthesis Example 1 was dropped onto a substrate of silicon wafer and spin-coated thereon for two minutes to produce a film so as to give a thickness after heat-treatment of 15 μm. During the course of the spin coating, nitrogen gas was supplied through the gas feed port at a rate of flow of $1.0\times10^{-3}$ m/sec to produce a sprayed layer of air flow 10 mm in thickness. The temperature inside the spin coater was 25° C.

Subsequently, the coating film was heat-treated in an atmosphere of nitrogen at 70° C. for two hours, at 160° C. for one hour, at 259° C. for 30 minutes, and at 350° C. for one hour. The polyimide coating film obtained by calcining had a flat smooth surface free from spots of foreign matter.

Example 7

A calcined coating film was obtained by following the procedure of Example 6 while using a 40.0 mass % polyamic acid solution obtained in Synthesis Example 2 instead. The calcined coating film had a flat smooth surface free from spots of foreign matter.

Example 8

A calcined coating film was obtained by following the procedure of Example 6 while changing the rate of flow to $1.0\times10^{-2}$ m/sec and the thickness of the layer of air flow to be formed by spraying to 5 mm and using a 30.0 mass % polyamic acid solution obtained in Synthesis Example 3 instead. The calcined coating film had a flat smooth surface free from spots of foreign substance.

Example 9

A calcined coating film was obtained by following the procedure of Example 6 while changing the rate of flow to $1.0\times10^{-1}$ m/sec and the thickness of the layer of air flow for spraying to 5 mm and using a 30.0 mass % polyamic acid solution obtained in Synthesis Example 3 instead. The calcined coating film had a flat smooth surface free from spots of foreign matter.

Comparative Example 3

A calcined coating film was obtained by following the procedure of Example 6 while changing the relative humidity to 60 RH % and the rate of flow to $1.0\times10^{-3}$ m/sec and the thickness of the layer of air flow for spraying to 70 mm. The calcined coating film formed numerous spots of foreign matter.

Comparative Example 4

A calcined coating film was obtained by following the procedure of Example 6 while changing the relative humidity to 35 RH %, the rate of flow to 2.0 m/sec, and the thickness of the layer of air flow for spraying to 10 mm. The calcined coating film formed had projections and depressions on the surface.

The entire disclosure of Japanese Patent Application Nos. 2003-059331 and 2003-05932 both filed on Mar. 6, 2003 including specification, claims, drawings and summary are incorporated herein by reference in its entirety.

The invention claimed is:

1. A method for the production of a fluorine-containing polyimide film which comprises forming a coating film of a fluorine-containing polyimide precursor by a spin coating method, which comprises dropping a fluorine-containing polyimide precursor onto a substrate and spin coating fluorine-containing polyimide precursor, wherein said coating film is formed while sprayed with a gas vented from a plate during the course of said spin coating, the distance between the plate and the substrate being in the range of 1 to 50 mm in an atmosphere having a relative humidity thereof adjusted to a level of no more than 50 RH % whereby the gas sprayed over the substrate generates a gas curtain preventing substances formed during said spin coating process from adhering to said coating film, and then subjecting said coating film to heat treatment thereby forming a fluorine-containing polyimide film.

2. A method according to claim 1, wherein the rate of flow of said gas is in the range of $1.5\times10^{-4}$ to 1 m/sec.

3. A method according to claim 1, wherein said fluorine-containing polyimide precursor is a wholly halogenated polyamic acid.

4. A method according to claim 2, wherein said fluorine-containing polyimide precursor is a wholly halogenated polyamic acid.

5. A method according claim 1, wherein the gas is nitrogen, helium, argon, carbon dioxide, or air.

6. A method according to claim 2, wherein the gas is nitrogen, helium, argon, carbon dioxide, or air.

7. A method according to claim 3, wherein the gas is nitrogen, helium, argon, carbon dioxide, or air.

8. A method according to claim 4, wherein the gas is nitrogen, helium, argon, carbon dioxide, or air.

9. A method according to claim 5, wherein the gas is nitrogen.

10. A method according to claim 6, wherein the gas is nitrogen.

11. A method according to claim 7, wherein the gas is nitrogen.

12. A method according to claim 8, wherein the gas is nitrogen.

* * * * *